United States Patent
Kadono et al.

(10) Patent No.: US 11,245,014 B2
(45) Date of Patent: Feb. 8, 2022

(54) METHOD OF PRODUCING EPITAXIAL SILICON WAFER, EPITAXIAL SILICON WAFER, AND METHOD OF PRODUCING SOLID-STATE IMAGING DEVICE

(71) Applicant: SUMCO CORPORATION, Tokyo (JP)

(72) Inventors: Takeshi Kadono, Tokyo (JP); Kazunari Kurita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/956,232

(22) PCT Filed: Aug. 24, 2018

(86) PCT No.: PCT/JP2018/031435
§ 371 (c)(1),
(2) Date: Jun. 19, 2020

(87) PCT Pub. No.: WO2019/130653
PCT Pub. Date: Jul. 4, 2019

(65) Prior Publication Data
US 2021/0083058 A1 Mar. 18, 2021

(30) Foreign Application Priority Data
Dec. 26, 2017 (JP) .............. JP2017-249862

(51) Int. Cl.
*H01L 29/36* (2006.01)
*H01L 21/02* (2006.01)
(Continued)

(52) U.S. Cl.
CPC .......... *H01L 29/36* (2013.01); *H01L 21/0251* (2013.01); *H01L 21/02381* (2013.01);
(Continued)

(58) Field of Classification Search
None
See application file for complete search history.

(56) References Cited

U.S. PATENT DOCUMENTS 10,396,120 B2 8/2019 Kadono et al.
2005/0269520 A1 12/2005 Horsky et al.
(Continued)

FOREIGN PATENT DOCUMENTS

JP 2009-283459 A 12/2009
JP 2010-114409 A 5/2010
(Continued)

OTHER PUBLICATIONS

Translation of JP2015041622, total pp. 11.*
(Continued)

*Primary Examiner* — Bo B Jang
(74) *Attorney, Agent, or Firm* — Greenblum & Bernstein, P.L.C.

(57) ABSTRACT

Provided is a method of producing an epitaxial silicon wafer having high gettering capability resulting in even more reduced white spot defects in a back-illuminated solid-state imaging device. The method includes: a first step of irradiating a surface of a silicon wafer with cluster ions of $C_nH_m$ (n=1 or 2, m=1, 2, 3, 4, or 5) generated using a Bernas ion source or an IHC ion source, thereby forming, in the silicon wafer, a modifying layer containing, as a solid solution, carbon and hydrogen that are constituent elements of the cluster ions; and a subsequent second step of forming a silicon epitaxial layer on the surface. In the first step, peaks of concentration profiles of carbon and hydrogen in the depth direction of the modifying layer are made to lie in a range of more than 150 nm and 2000 nm or less from the surface.

9 Claims, 7 Drawing Sheets (51) Int. Cl.
    *H01L 21/265*    (2006.01)
    *H01L 31/18*     (2006.01)
    *H01L 27/146*    (2006.01)

(52) U.S. Cl.
    CPC .. *H01L 21/02532* (2013.01); *H01L 21/26506* (2013.01); *H01L 31/1804* (2013.01); *H01L 27/1464* (2013.01)

(56) References Cited

U.S. PATENT DOCUMENTS

2009/0283695 A1    11/2009    Horsky et al.
2010/0090303 A1    4/2010     Takizawa

FOREIGN PATENT DOCUMENTS

| JP | 2015-41622 A | 3/2015 |
| JP | 2017-112276 A | 6/2017 |
| JP | 2017-157613 A | 9/2017 |
| KR | 10-2010-0040673 A | 4/2010 |
| KR | 10-2017-0041229 A | 4/2017 |
| KR | 10-2017-0101833 A | 9/2017 |
| TW | 201515069 A | 4/2015 |
| TW | 201729255 A | 8/2017 |
| WO | WO 2012/157162 A1 | 11/2012 |

OTHER PUBLICATIONS

Office Action for JP App. No. 2017-249862, dated Sep. 8, 2020 (w/translation).
ISR for PCT/JP2018/031435, dated Sep. 18, 2018.
Office Action for TW App. No. 10821241110, dated Dec. 30, 2019 (w/ English translation).
Office Action for TW App. No. 10820503800, dated May 29, 2019 (w/ English translation).
IPRP for PCT/JP2018/031435, dated Jun. 30, 2020 (w/ English translation).
Office Action for KR App. No. 10-2020-7009158, dated Sep. 7, 2021 (w/ translation).
Office Action for JP App. No. 2020-185382, dated Oct. 28, 2021 (w/ translation).

\* cited by examiner

FIG. 1A (First step)

FIG. 1B (Second step)

METHOD OF PRODUCING EPITAXIAL SILICON WAFER, EPITAXIAL SILICON WAFER, AND METHOD OF PRODUCING SOLID-STATE IMAGING DEVICE

TECHNICAL FIELD

This disclosure relates to a method of producing an epitaxial silicon wafer, an epitaxial silicon wafer, and a method of producing a solid-state imaging device.

BACKGROUND

Metal contamination is one of the factors that cause degradation in semiconductor device characteristics. For example, in the case of a back-illuminated solid-state imaging device, metal that is mixed into an epitaxial wafer used as a substrate of the imaging device is a factor causing increased dark current in the solid-state imaging device and causing the formation of defects referred to as white spot defects. In a back-illuminated solid-state imaging device, a wiring layer and the like are provided in a lower layer than a sensor area such that external light can be directly taken in by the sensor, enabling clear images and videos to be recorded even in dark locations. For this reason, back-illuminated solid-state imaging devices have become widely used in recent years in digital video cameras and mobile telephones such as smart phones. Therefore, it is desired to reduce white spot defects to as great an extent as possible.

Mixing of metal into a silicon wafer mainly occurs during a process of producing an epitaxial silicon wafer and a process of producing a back-illuminated solid-state imaging device. Metal contamination in the former process of producing a epitaxial silicon wafer may for example occur due to heavy metal particles from constituent materials of an epitaxial growth reactor or heavy metal particles produced through metal corrosion of piping materials as a result of a chlorine-containing gas being used in the reactor during epitaxial growth. The metal contamination described above has been improved in recent years through replacement of the constituent materials of epitaxial growth reactors with materials having superior corrosion resistance; however, this improvement is still insufficient. On the other hand, in the latter process of producing a back-illuminated solid-state imaging device, heavy metal contamination of an epitaxial silicon wafer is a concern during various processing steps such as ion implantation, diffusion, and oxidizing heat treatment.

For these reasons, contamination of epitaxial silicon wafers with metal is typically avoided by forming, in the epitaxial silicon wafer, a gettering layer for trapping the metal. For example, WO 2012/157162 A (PTL 1) discloses a method of producing an epitaxial silicon wafer, comprising: a fires step of irradiating a silicon wafer with cluster ions containing carbon to form a modifying layer in which carbon is contained as a solid solution; and a second step of forming a silicon epitaxial layer on the modifying layer. Here, the modifying layer is described as being preferably formed in the vicinity of the surface of the silicon wafer in the first step so that proximity gettering is possible. Specifically, PTL 1 describes that the peak of the concentration profile of carbon in the depth direction of the modifying layer preferably lies at a depth within 150 nm from the surface of the silicon wafer.

CITATION LIST

Patent Literature

PTL 1: WO 2012/157162 A

SUMMARY

Technical Problem

According to PTL 1, the modifying layer formed by applying cluster ions has gettering capability higher than that of an ion-implanted layer formed by implanting monomer ions (single ion). The high gettering capability is believed to be capable of reducing white spot defects of back-illuminated solid-state imaging devices. However, subsequent further studies made by inventors of this disclosure revealed that there was room for improvement.

In view of the above problem, it could be helpful to provide a method of producing an epitaxial silicon wafer, which makes it possible to obtain an epitaxial silicon wafer having high gettering capability resulting in even more reduced white spot defects in a back-illuminated solid-state imaging device. Further, it could be helpful to provide an epitaxial silicon wafer having high gettering capability resulting in even more reduced white spot defects in a back-illuminated solid-state imaging device.

Solution to Problem

Figure 3A:
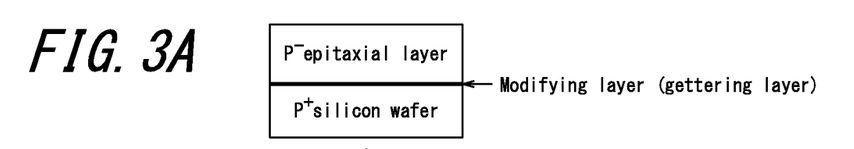
FIGS. 3A to 3E are cross-sectional views schematically illustrating a method of producing a back-illuminated solid-state imaging device.
Figure 3B:
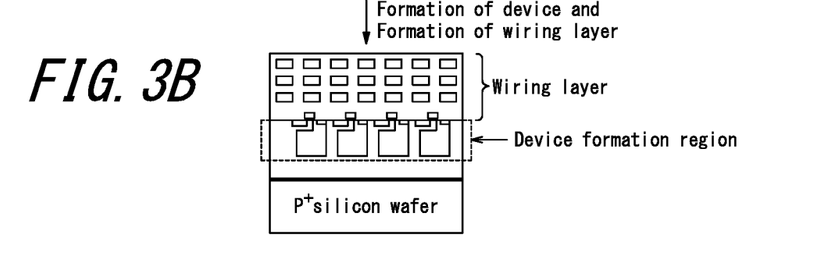
Figure 3C:
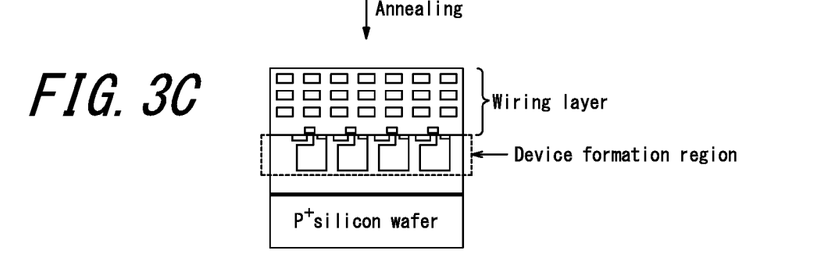
Figure 3D:
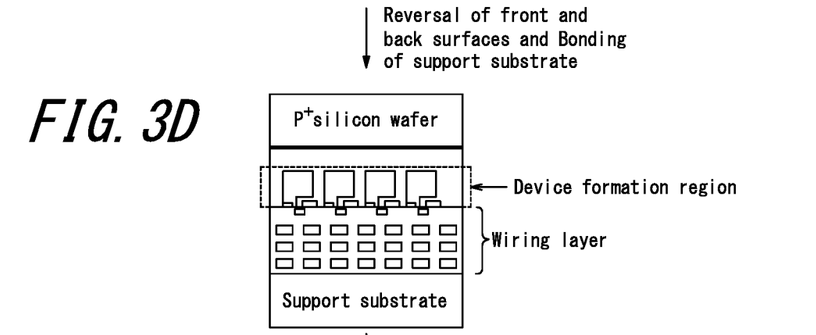
Figure 3E:
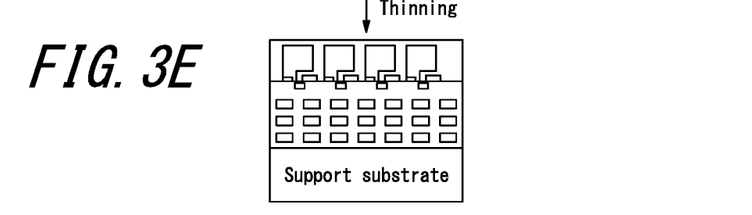

With a view to addressing the above challenges, the inventors studied processes of producing back-illuminated solid-state imaging devices. A back-illuminated solid-state imaging device is fabricated for example through the steps illustrated in FIGS. 3A to 3E. First, an epitaxial silicon wafer to be used as a substrate of a back-illuminated solid-state imaging device is prepared (FIG. 3A). This silicon epitaxial wafer has a $p^+$ silicon wafer; a modifying layer (gettering layer) containing, as a solid solution, carbon that is a constituent element of cluster ions, the modifying layer being formed in a surface layer of the $p^+$ silicon wafer; and a $p^-$ silicon epitaxial layer formed on the modifying layer. Next, devices such as photodiodes are formed on the $p^-$ silicon epitaxial layer, followed by the formation of wiring layers on the $p^-$ silicon epitaxial layer (FIG. 3B). Next, heavy metals diffused in the substrate are attracted to the modifying layer by annealing the epitaxial silicon wafer, thereby reducing the concentration of the heavy metals in a region where the devices are formed (device formation region) (FIG. 3C). Next, after reversing the front and back surfaces of the epitaxial silicon wafer, a support substrate and the epitaxial silicon wafer are bonded so that the wiring layer is situated between the support substrate and the epitaxial silicon wafer (FIG. 3D). Next, after removing the $p^+$ silicon wafer by grinding, the $p^-$ silicon epitaxial layer is thinned so that the device formation region (thickness: approximately 3 μm) is left (FIG. 3E). Through the above steps, a back-illuminated solid-state imaging device is completed.

In the back-illuminated solid-state imaging device, since the $p^-$ silicon epitaxial layer is eventually thinned, the $p^-$ silicon epitaxial layer before being thinned is designed to be as thin as approximately 6 μm as compared with approximately 10 μm that is the thickness of one in a front-illuminated solid-state imaging device. Accordingly, if a modifying layer is in the vicinity of the surface of the silicon wafer as in conventional devices, the peak of carbon in the modifying layer would lie near the device formation region formed in the p⁻ silicon epitaxial layer. When the carbon peck position is near the device formation region as descried above, the concentration profile of heavy metals in the thickness direction after annealing as depicted in FIG. 3C exhibits a higher concentration when closer to the modifying layer. Meanwhile, the tail of the concentration profile extends to the device formation region. This was found to result in white spot defects due to increased dark current in the back-illuminated solid-state imaging device.

The inventors made further studies in view of the above problem and found that when cluster ions of $C_nH_m$ (n=1 or 2, m=1, 2, 3, 4, or 5) are generated using a Bernas ion source or an IHC ion source conventionally used as an apparatus for generating monomer ions, the peak of the concentration profile of the constituent elements of the cluster ions in the depth direction of the modifying layer can be formed in positions even deeper (positions deeper than 150 nm) from the surface of the silicon wafer in the case where comparison is made with respect to the same irradiation energy as in conventional methods. Thus, an epitaxial silicon wafer having high gettering capability resulting in even more reduced white spot defects in a back-illuminated solid-state imaging device was found to be obtained.

This disclosure is completed based on the above findings, and we propose the following features.

(1) A method of producing an epitaxial silicon wafer, comprising:

a first step of irradiating a surface of a silicon wafer with cluster ions of $C_nH_m$ (n=1 or 2, m=1, 2, 3, 4, or 5) generated using one of a Bernas ion source and an IHC ion source, thereby forming, in the silicon wafer, a modifying layer containing, as a solid solution, carbon and hydrogen that are constituent elements of the cluster ions; and a second step of forming a silicon epitaxial layer on the surface after the first step, wherein in the first step, peaks of concentration profiles of the carbon and the hydrogen in a depth direction of the modifying layer are made to lie in an area with a depth in a range of more than 150 nm and 2000 nm or less from the surface of the silicon wafer.

(2) The method of producing an epitaxial silicon wafer, according to (1) above, wherein in the first step, the irradiation with the cluster ions is performed at a beam current value of 170 μA or more.

(3) The method of producing an epitaxial silicon wafer, according to (1) or (2) above, wherein in the first step, the irradiation with the cluster ions is performed so that a tilt angle and a twist angle of the silicon wafer are both 0°.

(4) The method of producing an epitaxial silicon wafer, according to any one of (1) to (3) above, further comprising a step of cleaning the surface of the silicon wafer between the first step and the second step.

(5) An epitaxial silicon wafer, comprising: a silicon wafer; a modifying layer containing carbon and hydrogen as a solid solution, the modifying layer being formed in the silicon wafer; and a silicon epitaxial layer formed on the modifying layer, wherein peaks of concentration profiles of the carbon and the hydrogen in the depth direction of the modifying layer lie in an area with a depth in a range of more than 150 nm and 2000 nm or less from a surface of the silicon wafer.

(6) The epitaxial silicon wafer according to (5) above, wherein a distance between the peak position of the concentration profile of the carbon in the depth direction and the peak position of the concentration profile of the hydrogen in the depth direction is within 1000 nm.

(7) The epitaxial silicon wafer according to (5) or (6) above, wherein the peak concentration of the concentration profile of the carbon in the depth direction and the peak concentration of the concentration profile of the hydrogen in the depth direction are both $1 \times 10^{16}$ atoms/cm³ or more.

(8) A method of producing a solid-state imaging device comprising forming a solid-state imaging device in the silicon epitaxial layer of one of the epitaxial silicon wafer produced according to the method of producing an epitaxial silicon wafer, according to any one of (1) to (4) above and the epitaxial silicon wafer according to any one of (5) to (7) above.

Advantageous Effect

According to this disclosure, an epitaxial silicon wafer having high gettering capability resulting in even more reduced white spot defects in a back-illuminated solid-state imaging device can be obtained.

DETAILED DESCRIPTION

Figure 1A:
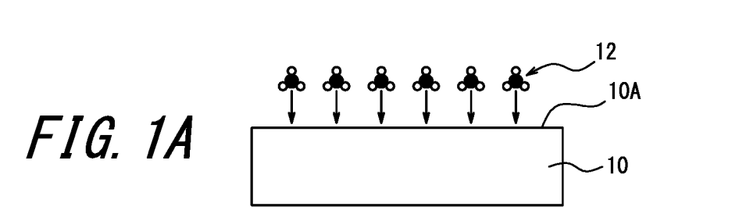
FIGS. 1A to 1C are cross-sectional views schematically illustrating a method of producing an epitaxial silicon wafer 100, according to an embodiment of this disclosure.
Figure 1B:
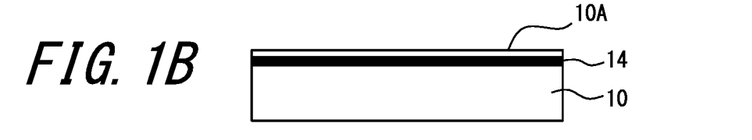
Figure 1C:
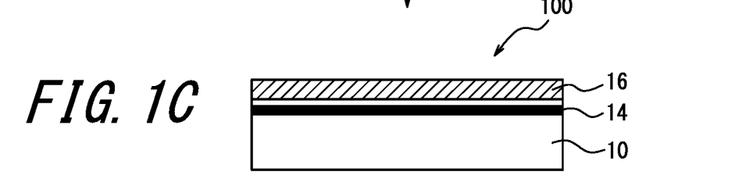

Embodiments of this disclosure will now be described in detail with reference to the drawings. Note that in FIG. 1, the thicknesses of a modifying layer 14 and a silicon epitaxial layer 16 are exaggerated relative to the thickness of a silicon wafer 10 for convenience of description; accordingly, the thicknesses are not to scale.

Method of Producing Epitaxial Silicon Wafer

Referring to FIGS. 1A to 1C, a method of producing an epitaxial silicon wafer 100 according to one embodiment of this disclosure is described. In this embodiment, in the first step, a surface 10A of a silicon wafer is irradiated with cluster ions 12 of $C_nH_m$ (n=1 or 2, m=1, 2, 3, 4, or 5) generated using a Bernas ion source or an IHC ion source to form a modifying layer 14 containing, as a solid solution, carbon and hydrogen that are constituent elements of the cluster ions 12 in the silicon wafer 10 (FIGS. 1A and 1B). Here, peaks of the concentration profiles of carbon and hydrogen in the depth direction of the modifying layer 14 are made to lie in an area with a depth in a range of more than 150 nm and 2000 nm or less from the surface 10A (that is, the surface irradiated with the cluster ions 12) of the silicon wafer. Next, in the second step, a silicon epitaxial layer 16 is formed on the surface 10A (FIGS. 1B and 1C). FIG. 1C is illustrated in a schematic cross-sectional view of the epitaxial silicon wafer 100 obtained by this production method. These steps will be described in detail below.

First Step

Referring to FIGS. 1A and 1B, in the first step, the surface 10A of the silicon wafer is irradiated with cluster ions 12 of $C_nH_m$ (n=1 or 2, m=1, 2, 3, 4, or 5) generated using a Bernas ion source or an IHC ion source. The cluster ions 12 introduced into the silicon wafer 10 melts upon being instantaneously heated to a temperature as high as around 1350° C. to 1400° C. and is then rapidly cooled so that carbon and hydrogen that are constituent elements of the cluster ions 12 are recrystallized at a position of a predetermined depth in the silicon wafer 10. Thus, the modifying layer 14 locally containing a solid solution at high concentration is formed. As the silicon wafer 10, a single crystal silicon wafer obtained by slicing, with a wire saw or the like, a single crystal silicon ingot grown by the Czochralski process (CZ process) or the floating zone melting process (FZ process) can be used. Alternatively, an n-type or p type silicon wafer obtained by doping such a single crystal silicon wafer with given impurities may be used; for example, a silicon wafer doped with carbon and/or nitrogen may be used.

The modifying layer 14 formed in the first step serves as a gettering site, and the reason is assumed as follows. That is, carbon and hydrogen introduced into the silicon wafer 10 are locally present at high density at substitution positions or interstitial positions of the silicon single crystal. It has been experimentally found that when carbon and hydrogen are turned into a solid solution at the equilibrium concentration of the silicon single crystal or higher, the solid solubility of heavy metals (saturation solubility of transition metal) is extremely high. In other words, it appears that carbon and hydrogen made into a solid solution at the equilibrium concentration or higher increases the solubility of heavy metals, which results in significantly increased rate of trapping of the heavy metals.

Here, in this disclosure, it is important that the irradiation with cluster ions of $C_nH_m$ (n=1 or 2, m=1, 2, 3, 4, or 5) generated using a Bernas ion source or an IHC ion source is performed so that peaks of the concentration profiles of carbon and hydrogen in the depth direction of the modifying layer 14 lie in an area with a depth in a range of more than 150 nm and 2000 nm or less from the surface 10A of the silicon wafer. Hereinafter, a Bernas ion source and an IHC ion source and one form of the ion irradiation apparatus 70 including the ion source will be described with reference to FIGS. 2A to 2C. Note that "cluster ions" herein mean clusters formed by aggregation of two or more kinds of atoms, which have positive or negative charges. "Cluster size" herein means the number of atoms forming one cluster.

Figure 2A:
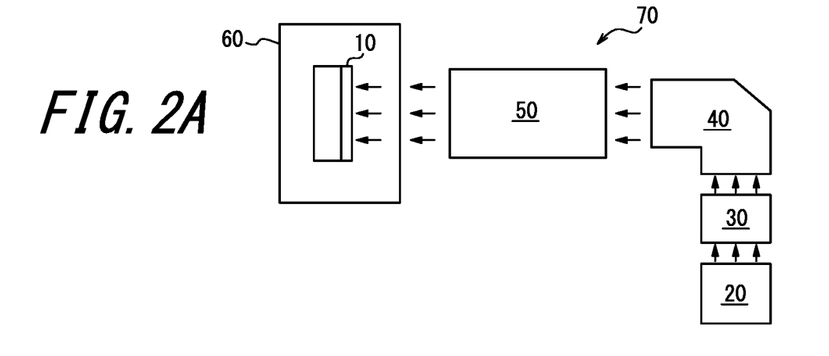
FIG. 2A is a schematic view of an ion irradiation apparatus 70 that can be used in an embodiment of this disclosure.

Referring to FIG. 2A, the ion irradiation apparatus 70 includes an ion source 20, a pre-accelerator system 30, a mass analysis system 40, a post accelerator system 50, and an irradiation chamber 60. First, cluster ions are generated in the ion source 20 to form ion beams, and the ion beams are sent to the pre-accelerator system 30. Next, the cluster ions are accelerated (pre-accelerated) in the pre-accelerator system 30 to form ion beams and sent to the mass analysis system 40. Next, in the mass analysis system 40, mass analysis using a magnetic field is performed to extract only cluster ions having a predetermined mass as ion beams, and the ion beams are sent to the post accelerator system 50. Next, in the post accelerator system 50, the cluster ions are further accelerated (post-accelerated) to form ion beams, and the ion beams are sent to the irradiation chamber 60. Next, in the irradiation chamber 60, the silicon wafer 10 placed and fixed on a wafer holder is irradiated with the ion beams. Note that the ion beams are cluster ions that are focused and travel as parallel fluxes, and the arrows in FIG. 2A indicate the ion beams.

Figure 2B:
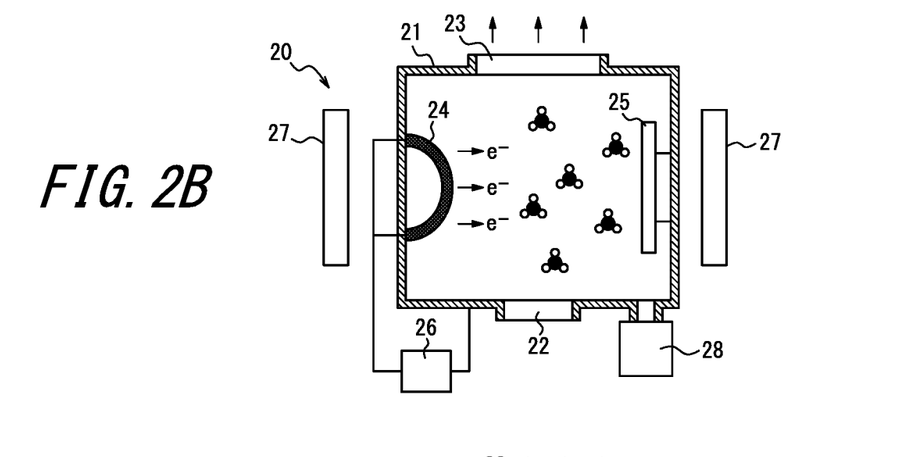
FIG. 2B is a schematic diagram illustrating the case of using a Bernas ion source as an ion source 20.
Figure 2C:
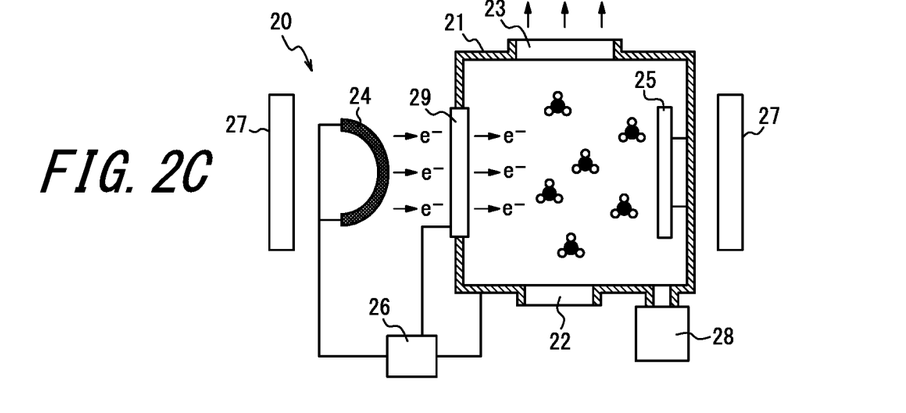
FIG. 2C is a schematic diagram illustrating the case of using an IHC ion source as an ion source 20.

As the ion source 20 depicted in FIG. 2A, a Bernas ion source or an indirectly heated cathode (IHC) ion source can be used. Referring to FIGS. 2B and 2C, methods of generating cluster ions using a Bernas ion source and an IHC ion source will be described below.

Referring FIG. 2B, the Bernas ion source 20 has an arc chamber 21, a source gas inlet 22, an ion outlet 23, a U-shaped filament 24, a reflector 25, a current voltage application unit 26, magnetic field generating devices 27, and a vacuum pump 28. The arc chamber 21 is a chamber defining an ion generation chamber. The source gas inlet 22 is provided on the arc chamber 21, and the source gas is introduced into the arc chamber 21 through the inlet. The ion outlet 23 is provided on the arc chamber 21 preferably in a position opposite to the source gas inlet 22, and cluster ions generated in the arc chamber 21 are accelerated by the pre-accelerator system 30. The filament 24 and the reflector 25 are provided at positions facing each other in the arc chamber 21. The current voltage application unit 26 is provided outside the arc chamber 21 and is connected to the arc chamber 21 and the filament 24. The magnetic field generating devices 27 are provided outside the arc chamber 21 to face each other. The vacuum pump 28 is connected to the arc chamber 21.

The Bernas ion source 20 generates cluster ions by the following method. First, the arc chamber 21 is depressurized using the vacuum pump 28. Next, a source gas is introduced into the arc chamber 21 through the source gas inlet 22. Next, while positive voltage is applied to the arc chamber 21, negative voltage is applied to the filament 24 by the current voltage application unit 26. Next, a magnetic field is generated in the arc chamber 21 by the magnetic field generating devices 27. Next, a current is flown to the filament 24 by the current voltage application unit 26 to heat the filament 24. Thus, thermions $e^-$ emitted from the filament 24 reciprocate between the filament 24 and the reflector 25 due to the influence of the electric field and the magnetic field, and the thermions $e^-$ collide with the source gas with high probability. As a result, the source gas is ionized very efficiently, and a plasma of the source gas with high density is formed. Next, the cluster ions of the source gas, contained in the plasma formed are taken out of the ion outlet 23 as ion beams.

Referring to FIG. 2C, unlike in the Bernas ion source, in the IHC ion source, the filament 24 is provided outside the arc chamber 21 so as not to be directly exposed to plasma. Further, the cathode 29 is provided on a wall of the arc chamber 21 to face the filament 24, and the current voltage supply apparatus 26 is also connected to the cathode 29. Note that the other structure is the same as that of the Bernas ion source described with reference to FIG. 2B.

The IHC ion source 20 generates cluster ions by the following method. First, the arc chamber 21 is depressurized by the vacuum pump 28. Next, a source gas is introduced into the arc chamber 21 through the source gas inlet 22. Next, while positive voltage is applied to the arc chamber 21 and the filament 24, negative voltage is applied to the cathode 29 by the current voltage application unit 26. Next, a magnetic field is generated in the arc chamber 21 by the magnetic field generating devices 27. Next, a current is flown to the filament 24 by the current voltage application unit 26 to heat the filament 24. Thus, thermions $e^-$ emitted from the filament 24 hit the cathode 29, thus the cathode 29 is heated. Subsequently, more thermions $e^-$ are generated from the cathode 29, and these thermions $e^-$ reciprocate between the cathode 29 and the reflector 25 due to the influence of the electric field and the magnetic field, and the thermions $e^-$ collide with the source gas with high probability. As a result, the source gas is ionized very efficiently, and a plasma of the source gas with high density is formed. Next, the cluster ions of the source gas, contained in the plasma formed are taken out from the ion outlet 23 as ion beams.

Note that the IHC ion source can be easily controlled to form plasma of high density as compared with the Bernas ion source, so that a high beam current value is easily ensured; further, since the filament 24 is not directly exposed to plasma, the IHC ion source has long life.

Examples of the source gas include 2-methylpentane and 2,4-dimethylpentane. 2-methylpentane and 2,4-dimethylpentane have CH systems in their molecular structures, and C=C bonds are cleaved by the thermions $e^-$ in the ion source 20. Consequently, cluster ions having a small cluster size, such as cluster ions of $C_nH_m$ (n=1 or 2, m=1, 2, 3, 4, or 5) are obtained. In the first step, for the irradiation, one type of cluster ions of $C_nH_m$ (n=1 or 2, m=1, 2, 3, 4, or 5) may be used or two or more types thereof may be used in combination; however, the irradiation is particularly preferably performed with $CH_3$. Since $CH_3$ has a higher concentration ratio of hydrogen with respect to carbon, and use of $CH_3$ allows more hydrogen to be introduced, thus white spot defects due to the interface state density can be reduced more by the passivation effect. Note that such particular kinds of cluster ions can be obtained by performing mass analysis by a known or given method using the mass analysis system 40 depicted in FIG. 2A.

In addition, as the source gas, a gas containing oxygen such as diethyl ether, 2-propanol, 2-methyl-2-propanol, or tetrahydropyran may be used. When the source gas contains oxygen, carbon-based deposits accumulated in the arc chamber 21 or on the filament 24 are sputtered by oxygen ions, thus the life and performance of the ion source can be improved. The composition ratio of carbon with respect to oxygen is preferably twice or more. For example, when the proportion of oxygen is high as in the case where the composition ratio between carbon and oxygen is 1:1, the filament 24 is excessively sputtered by oxygen ions and thermions would hardly be generated.

The pressure inside the arc chamber 21 is preferably $5.0 \times 10^{-2}$ Pa or less.

The voltage in the arc chamber 21 (arc voltage) is preferably 45 V or more and 90 V or less, and the current in the arc chamber 21 (arc current) is preferably 100 mA or more and 5000 mA or less. Such ranges of voltage and current allows for a beam current of 170 µA or more.

The magnetic field generating devices 27 preferably generate an external magnetic field of 0.5 A/m or more and 1.5 A/m or less.

The flow rate of the source gas is preferably 3 cc/min or more and 5 cc/min or less. A flow rate of 3 cc/min or more ensures a beam current of 170 µA or more even when the cluster size of the cluster ions is as small as $C_nH_m$ (n=1 or 2, m=1, 2, 3, 4, or 5), and when the flow rate is 5 cc/min or less, the beam current value would hardly be reduced due to the carbonized deposits.

As a material of the filament 24, typical tungsten may be used. In terms of increasing the life of the ion source 20 by preventing a product of reaction between an unionized hydrocarbon compound contained in the source gas and the material of the filament 24 from being formed on the filament 24, tantalum is more preferably used.

Such a Bernas or IHC ion source is conventionally used as a system for generating monomer ions such as carbon ions or phosphorus ions using carbon dioxide or phosphine as a raw material, and is a system intended for the generation of monoatomic ions by completely cleaving molecular bonds in the source gas, thus the source gas is ionized very efficiently. In this embodiment, since a Bernas ion source or an IHC ion source having very high ionizing efficiency is used as a system for generating cluster ions, namely, a source gas for generating cluster ions is introduced into the ion source; cluster ions having a cluster size smaller than that of conventional cluster ions of for example $C_nH_m$ (3≤n≤16, 3≤m≤10) can be generated at a beam current value of as high as 170 µA or more. Accordingly, when a comparison is made with respect to the same irradiation energy as that in conventional methods, the peaks of the concentration profiles of carbon and hydrogen in the depth direction of the modifying layer 14 can be formed in a deeper area, specifically in an area with a depth in a range of more than 150 nm from the surface 10A of the silicon wafer. As a result, an epitaxial silicon wafer having high gettering capability resulting in even more reduced white spot defects in a back-illuminated solid-state imaging device can be obtained. Note that "concentration profile" herein means a concentration distribution in the depth direction, which found by measurements using secondary ion mass spectrometry (SIMS). By contrast, the technique described in PTL 1 is a technique that preferably enables proximity gettering, and is actually a gettering technique suitable for front-illuminated solid-state imaging devices. Thus, the ion source mentioned in PTL 1 is a system originally intended for the generation of cluster ions having a large cluster size like cluster ions of $C_nH_m$ (3≤n≤16, 3≤m≤10), and plasma is not formed in the chamber of the ion source. Therefore, it is technically difficult for the ion source to generate cluster ions having a small cluster size at a high beam current value.

The acceleration energy of cluster ions is preferably 30 keV/Cluster or more and 40 keV/Cluster or less in the pre-accelerator system 30. The acceleration energy is preferably 40 keV/Cluster or more and 970 keV/Cluster or less in the post accelerator system 50. When the total acceleration energy in the pre-accelerator system 30 and the post accelerator system 50 is 70 keV/Cluster or more, the peaks of the concentration profiles of carbon and hydrogen can be made to lie in an area with a depth in a range of 150 nm or more from the surface 10A of the silicon wafer, and when the total acceleration energy is 970 keV/Cluster or less, the peaks of the concentration profiles of carbon and hydrogen in the depth direction of the modifying layer 14 can be made to lie in an area with a depth in a range of 2000 nm or less from the surface 10A of the silicon wafer. In this embodiment, the acceleration energy of cluster ions having passed through the post accelerator system 50 is the irradiation energy at the silicon wafer 10.

The dose of cluster ions can be adjusted by controlling the beam current value and the ion irradiation time within the following ranges. In this embodiment, since a beam current value of as high as 170 µA or more is obtained in the ion source 20, the ion irradiation time can be set to be short as compared with that in the case of conventional cluster ion irradiation. For example, when cluster ions of $CH_3$ are applied at a dose of $1.0 \times 10^{15}$ atoms/cm$^2$, the ion irradiation time can be adjusted within a range of 180 s to 2120 s. Accordingly, damages to the surface 10A of the silicon wafer, incident to the cluster ion irradiation can be reduced, and epitaxial defects with a size of 150 nm or more can be reduced to 10/wafer or less. The dose is preferably $1 \times 10^{13}$ atoms/cm$^2$ or more and $1 \times 10^{16}$ atoms/cm$^2$ or less, more preferably $5 \times 10^{13}$ atoms/cm$^2$ or less. When the dose is $1 \times 10^{13}$ atoms/cm$^2$ or more, the peak concentrations of the concentration profiles of carbon and hydrogen in the depth direction can be $1 \times 10^{16}$ atoms/cm$^3$ or more, thus higher gettering capability can be obtained, and when the dose is $1 \times 10^{16}$ atoms/cm$^2$ or less, epitaxial defects would not be formed.

In the irradiation with cluster ions, the tilt angle defined as an angle formed between the normal line of the surface 10A of the silicon wafer and the ion beams is preferably 0°, and the twist angle defined as an angle obtained by rotating the silicon wafer 10 on its center from a reference position (notch) is preferably 0°. This reduces damages to the surface 10A of the silicon wafer, incident to the cluster ion irradiation, resulting in reduced epitaxial defects of 10/wafer or less.

Second Step

Referring to FIGS. 1B and 1C, in the second step, a silicon epitaxial layer 16 is formed on a surface 10A of the surfaces of the silicon wafer 10, on which the modifying layer is formed (that is, the surface irradiated with the cluster ions 12), by chemical vapor deposition (CVD). For example, a source gas such as dichlorosilane or trichlorosilane is introduced into the chamber using hydrogen as a carrier gas, and the silicon epitaxial layer 16 is epitaxially grown at 1000° C. or more and 1150° C. or less. The thickness of the silicon epitaxial layer 16 is preferably 1 µm or more and 10 µm or less. When the thickness is 1 µm or more, the resistivity of the silicon epitaxial layer would not be changed due to dopants out-diffused from the silicon wafer, and when the thickness is 10 µm or less, spectral sensitivity characteristics of the solid-state imaging device would not be affected. In particular, in the case where part of the silicon epitaxial layer 16 is used as a device formation region for producing a back-illuminated solid-state imaging device, the thickness of the silicon epitaxial layer 16 is more preferably 3 µm or more and 6 µm or less.

A method of producing an epitaxial silicon wafer, according to this disclosure has been described using this embodiment as an example; however, this disclosure is not limited to the above embodiment, and modifications may be made as appropriate without departing from the scope defined by the claims.

For example, the method may have a step of performing SC-1 (for example, with a solution having a volume ratio of $H_2O:H_2O_2:NH_4OH=5:1:1$) or SC-2 (for example, with a solution having a volume ratio of $H_2O:H_2O_2:HCl=6:1:1$) on the surface 10A of the silicon wafer between the first step and the second step. This can remove particles or heavy metals on the surface 10A.

Epitaxial Silicon Wafer

Referring to FIG. 1C, the epitaxial silicon wafer 100 obtainable by the above production method will be described. The epitaxial silicon wafer 100 has a silicon wafer 10, a modifying layer 14 containing carbon and hydrogen as a solid solution, formed in the silicon wafer 10, and a silicon epitaxial layer 16 formed on the modifying layer 14. Further, peaks of the concentration profiles of carbon and hydrogen in the depth direction of the modifying layer 14 lie in an area with a depth in a range of more than 150 nm and 2000 nm or less from the surface 10A of the silicon wafer.

The epitaxial silicon wafer 100 gives the following operation and effect. Specifically, the epitaxial silicon wafer 100 has high gettering capability since the area where carbon and hydrogen that are constituent elements of the cluster ions 12 precipitate can be localized at a high concentration. Further, in the epitaxial silicon wafer 100, peaks of the concentration profiles of carbon and hydrogen in the depth direction of the modifying layer 14 lie in an area with a depth in a range of more than 150 nm and 2000 nm or less from the surface 10A of the silicon wafer. Thus, white spot defects in the back-illuminated solid-state imaging device can be reduced more.

Since the modifying layer 14 contains constituents elements of cluster ions of $C_nH_m$ (n=1 or 2, m=1, 2, 3, 4, or 5) as a solid solution, the distance between the peak position of the concentration profile of carbon in the depth direction and the peak position of the concentration profile of hydrogen in the depth direction can be controlled to 1000 nm or less by appropriately selecting the kinds of elements constituting the cluster ions and the number of atoms constituting the cluster ions.

In terms of obtaining even higher gettering capability, the peak concentration in the concentration profile of carbon in the depth direction and the peak concentration in the concentration profile of hydrogen in the depth direction are preferably $1 \times 10^{16}$ atoms/cm$^3$ or more each.

An epitaxial silicon wafer according to this disclosure has been described using this embodiment as an example; however, this disclosure is not limited to the above embodiment, and modifications may be made as appropriate without departing from the scope defined by the claims.

Method of Producing Solid-state Imaging Device

In a method of producing a back-illuminated solid-state imaging device according to one embodiment of this disclosure, a solid-state imaging device is formed in the silicon epitaxial layer 16 placed on the surface of the epitaxial silicon wafer produced by the above method of producing an epitaxial silicon wafer or the above epitaxial silicon wafer, that is, the epitaxial silicon wafer 100. The solid-state imaging device obtained by this production method can reduce the formation of white spot defects more than in conventional devices.

EXAMPLES

Example

Cluster Ion Generation

Ions were generated using an IHC ion source (IMPHEAT manufactured by Nissin Ion Equipment Co., Ltd.) depicted in FIG. 2C using 2-methylpentane as a source gas. The pressure of an arc chamber was set to $2.2 \times 10^{-2}$ Pa, the voltage of the arc chamber was set to 76 V, the current was set to 2200 mA, the external magnetic field was set to 0.6 A/m, and the flow rate of the source gas was set to 4.0 cc/min.

Figure 4:
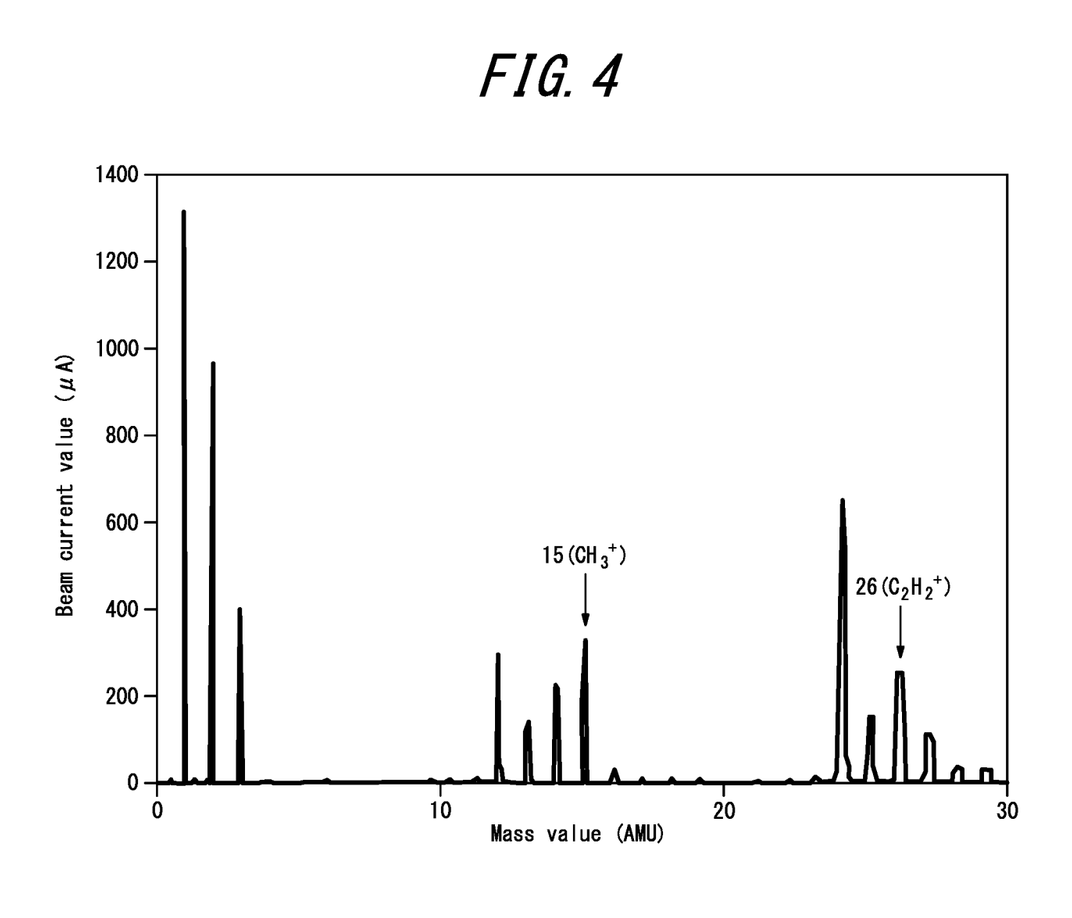
FIG. 4 is a graph illustrating the beam current value corresponding to the mass value of a plurality of kinds of ions generated using an IHC ion source.

Here, the mass of ions generated in the IHC ion source was analyzed using the mass analysis system depicted in FIG. 2A. The analysis results are given in FIG. 4. The fragment corresponding to a mass value of 15 (AMU) found in FIG. 4 indicates cluster ions of $CH_3$ and the fragment corresponding to a mass value of 26 (AMU) indicates cluster ions of $C_2H_2$. The beam current value of $CH_3$ was 325 μA, and the beam current value of $C_2H_2$ was 250 μA. Thus, it was found that cluster ions having a cluster size smaller than that of conventional cluster ions could be generated at a beam current value of as high as 170 μA or more using the IHC ion source. Note that the fragments other than the fragments of $CH_3$ and $C_2H_2$ found in FIG. 4 correspond to for example monoatomic ions, single atoms, or molecular ions of hydrogen and carbon.

Production of Epitaxial Silicon Wafer

The cluster ions of $CH_3$ were extracted from the ions generated under the above conditions, and a surface of a p-type silicon wafer 10 (thickness: 725 μm, dopant: boron, dopant concentration: $8.5 \times 10^{18}$ atoms/cm$^3$) was irradiated with the extracted cluster ions (FIG. 1A), thereby forming, in the silicon wafer, a modifying layer 14 containing, as a solid solution, carbon and hydrogen that were constituent elements of the cluster ions (FIG. 1B). The dose was $1 \times 10^{15}$ atoms/cm$^2$; the total irradiation energy in the pre-acceleration and the post acceleration was 80 keV/Cluster; the tilt angle was 0°; and the twist angle was 0°.

Next, the silicon wafer was transferred into a single-wafer processing epitaxial growth apparatus (manufactured by Applied Materials, Inc.), and was subjected to hydrogen bakeout at a temperature of 1120° C. for 30 s in the apparatus, followed by the epitaxial growth of a silicon epitaxial layer (thickness: 6 μm, dopant: boron, dopant concentration: $1.0 \times 10^{15}$ atoms/cm$^3$) on one of the surfaces of the silicon wafer, on which the modifying layer was formed, by CVD at 1150° C. using hydrogen as a carrier gas and dichlorosilane as a source gas, thus an epitaxial silicon wafer 100 according to this disclosure was formed (Step C in FIG. 1).

Comparative Example

Cluster Ion Generation

Cluster ions of $C_3H_5$ were generated using a cluster ion generating apparatus (CLARIS produced by Nissin Ion Equipment Co., Ltd.) using cyclohexane as a source gas. The beam current value of the cluster ions was 850 μA.

Production of Epitaxial Silicon Wafer

A surface of a p-type silicon wafer (thickness: 725 μm, dopant: boron, dopant concentration: $8.5 \times 10^{18}$ atoms/cm$^3$) was irradiated with the cluster ions of $C_3H_5$, thereby forming, on the surface of the silicon wafer, a modifying layer containing, as a solid solution, carbon and hydrogen that were constituent elements of the cluster ions. The dose was $1 \times 10^{15}$ atoms/cm$^2$; the irradiation energy was 80 keV/Cluster; the tilt angle was 0°; and the twist angle was 0°.

Next, the silicon wafer was transferred into a single-wafer processing epitaxial growth apparatus (manufactured by Applied Materials, Inc.), and was subjected to hydrogen bakeout at a temperature of 1120° C. for 30 s in the apparatus, followed by the epitaxial growth of a silicon epitaxial layer (thickness: 6 μm, dopant: boron, dopant concentration: $1.0 \times 10^{15}$ atoms/cm$^3$) on one of the surfaces of the silicon wafer, on which the modifying layer was formed, by CVD at 1150° C. using hydrogen as a carrier gas and dichlorosilane as a source gas, thus an epitaxial silicon wafer was formed.

Evaluation Method and Evaluation Results

The epitaxial silicon wafers of Example and Comparative Example were subjected to secondary ion mass spectrometry (SIMS) to obtain the concentration profiles of carbon and hydrogen that were the elements used for the irradiation. The evaluation results are given in FIGS. 5A and 5B and FIGS. 6A and 6B.

Figure 5A:
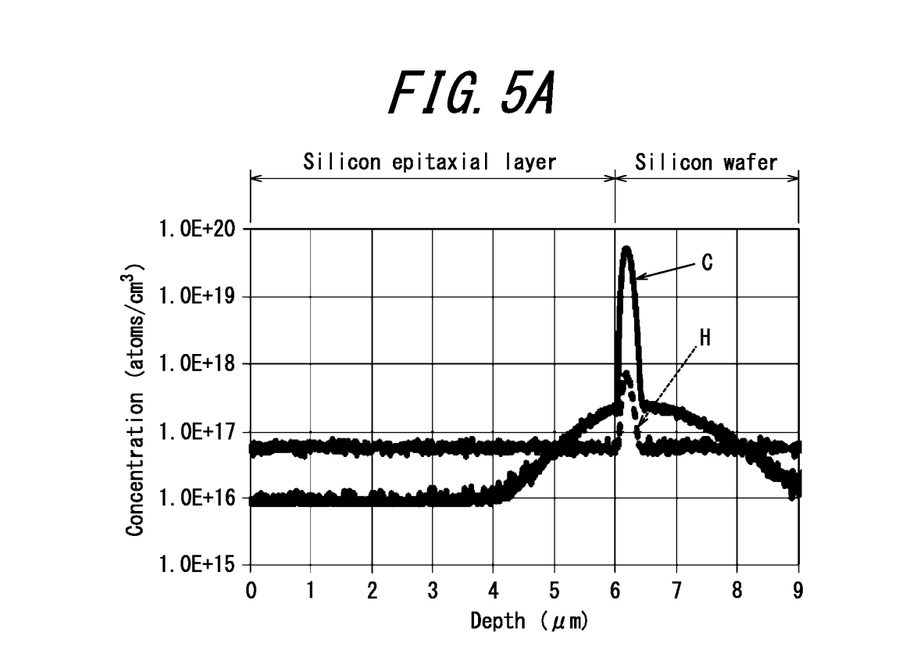
FIG. 5A is a graph illustrating the concentration profiles of carbon and hydrogen in the depth direction of the epitaxial silicon wafer 100 according to Example.
Figure 5B:
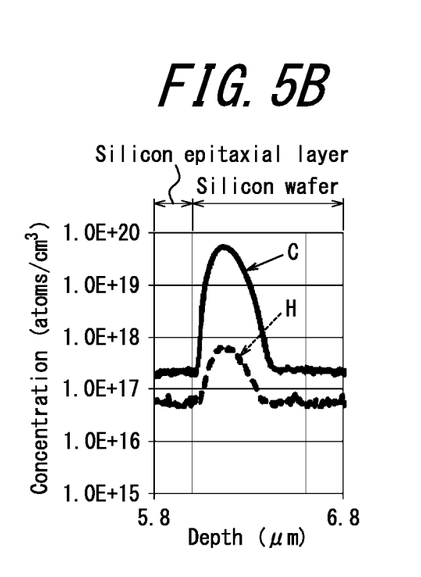
FIG. 5B is an enlarged view of the vicinity of the peak positions depicted FIG. 5A.
Figure 6A:
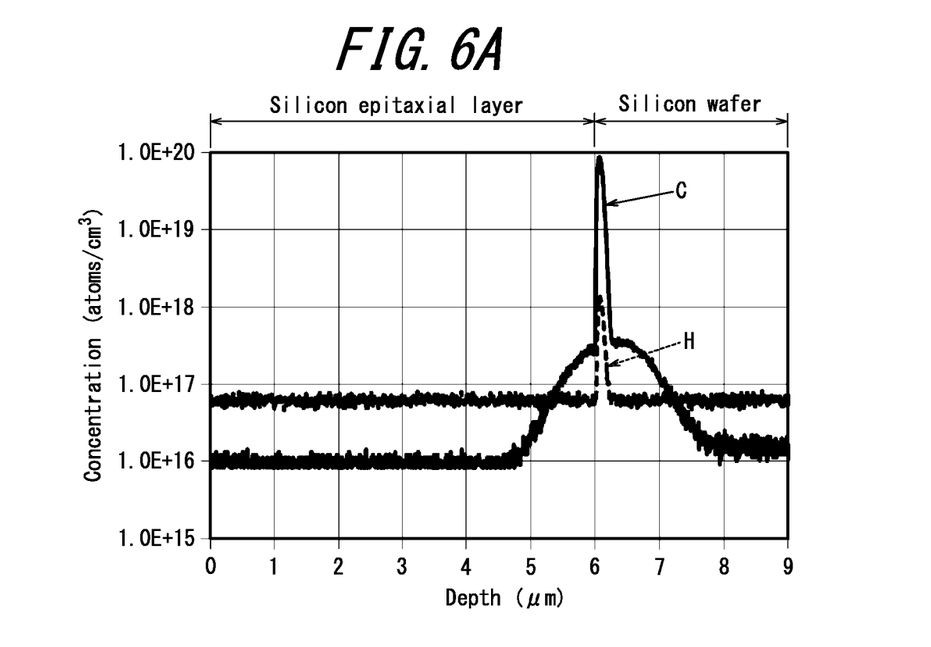
FIG. 6A is a graph illustrating the concentration profiles of carbon and hydrogen in the depth direction of an epitaxial silicon wafer according to Comparative Example.
Figure 6B:
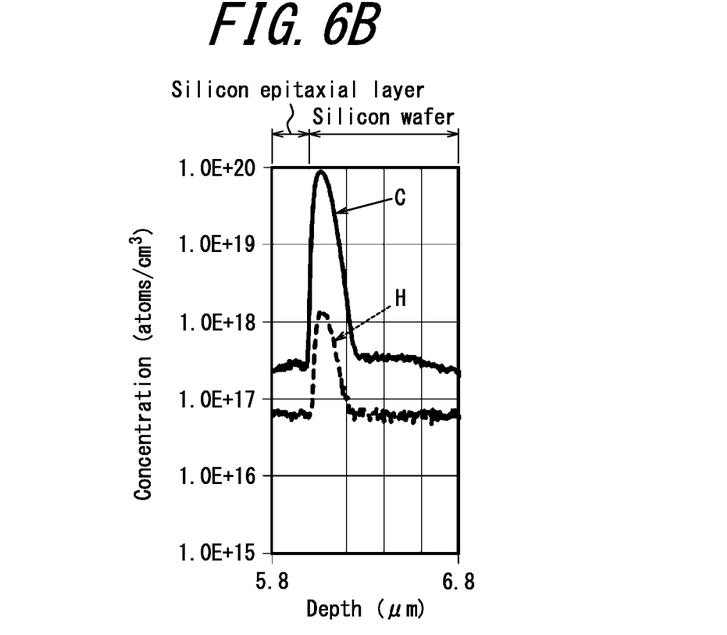
FIG. 6B is an enlarged view of the vicinity of the peak positions depicted FIG. 6A.

In Example, as depicted in FIGS. 5A and 5B, the peak of the concentration profile of carbon lain at a position of 167 nm from the interface between the silicon epitaxial layer and the silicon wafer (that is, one of the surfaces of the silicon wafer, irradiated with the cluster ions), and the peak concentration was $5.37 \times 10^{19}$ atoms/cm$^3$. Further, the peak of the concentration profile of hydrogen lain at a position of 167 nm from the interface between the silicon epitaxial layer and the silicon wafer, and the peak concentration was $7.36 \times 10^{17}$ atoms/cm$^3$. On the other hand, in Comparative Example, as depicted in FIGS. 6A and 6B, the peak of the concentration profile of carbon lain at a position of 80 nm from the interface between the silicon epitaxial layer and the silicon wafer, and the peak concentration was $8.65 \times 10^{19}$ atoms/cm$^3$. Further, the peak of the concentration profile of hydrogen lain at a position of 80 nm from the interface between the silicon epitaxial layer and the silicon wafer, and the peak concentration was $1.35 \times 10^{18}$ atoms/cm$^3$. Thus, the peak position in Example was deeper than that in Comparative Example.

The surface of the silicon epitaxial layer in each of Examples and Comparative Examples was contaminated on purpose by the spin coat contamination process using a Ni contaminating agent ($1.0 \times 10^{13}$/cm$^2$) and was then subjected to heat treatment at 900° C. for 30 minutes in a nitrogen atmosphere. After that, measurements were performed by secondary ion mass spectrometry (SIMS), thus the concentration profile of Ni in the depth direction was obtained. The evaluation results are given in FIG. 7.

Figure 7:
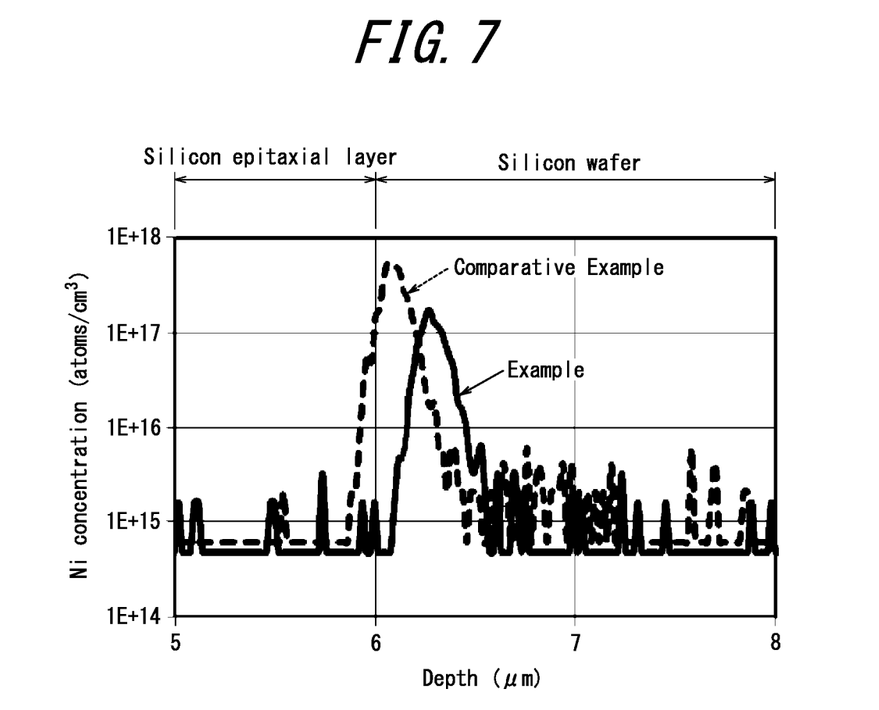
FIG. 7 is a graph illustrating the concentration profile of Ni in the depth direction of the epitaxial silicon wafers in Example and Comparative Example.

As evident from FIG. 7, in both Example and Comparative Example, high gettering capability was obtained since the modifying layer served as a gettering site. Further, in Example, due to the fact that the peak positions of carbon and hydrogen were found at deeper positions than in Comparative Example, the tail of the concentration profile of Ni was prevented from extending to the silicon epitaxial layer as compared with Comparative Example. This indicates that white spot defects would be reduced more when a back-illuminated solid-state imaging device is fabricated using the epitaxial silicon wafer of Example than in the case of using the epitaxial silicon wafer of Comparative Example.

INDUSTRIAL APPLICABILITY

According to this disclosure, an epitaxial silicon wafer having high gettering capability resulting in even more reduced white spot defects in a back-illuminated solid-state imaging device is obtained.

REFERENCE SIGNS LIST

100: Epitaxial silicon wafer
10: Silicon wafer
10A: Surface of silicon wafer
12: Cluster ions
14: Modifying layer
16: Silicon epitaxial layer
20: Ion source
21: Arc chamber
22: Source gas inlet
23: Ion outlet
24: Filament
25: Reflector
26: Current voltage supply unit
27: Magnetic field generating devices
28: Vacuum pump
29: Cathode
30: Pre-accelerator system
40: Mass analysis system
50: Post accelerator system
60: Irradiation chamber
70: Ion irradiation apparatus

The invention claimed is:

1. A method of producing an epitaxial silicon wafer, comprising:
   irradiating a surface of a silicon wafer with cluster ions of $C_nH_m$ (n=1 or 2, m=1, 2, 3, 4, or 5) generated using one of a Bernas ion source and an indirectly heated cathode (IHC) ion source, thereby forming, in the silicon wafer, a modifying layer containing, as a solid solution, carbon and hydrogen that are constituent elements of the cluster ions; and
   forming a silicon epitaxial layer on the surface of the silicon wafer after the irradiating the surface of the silicon wafer with the cluster ions,
   wherein in the irradiating the surface of the silicon wafer with the cluster ions, peaks of concentration profiles of the carbon and the hydrogen in a depth direction of the modifying layer are made to lie in an area with a depth in a range of more than 150 nm and 2000 nm or less from the surface of the silicon wafer.

2. The method of producing an epitaxial silicon wafer according to claim 1, wherein the irradiation with the cluster ions is performed at a beam current value of 170 μA or more.

3. The method of producing an epitaxial silicon wafer according to claim 1, wherein the irradiation with the cluster ions is performed so that a tilt angle and a twist angle of the silicon wafer are both 0°.

4. The method of producing an epitaxial silicon wafer according to claim 1, further comprising cleaning the surface of the silicon wafer between the irradiating the surface of the silicon wafer with the cluster ions and the forming the silicon epitaxial layer.

5. A method of producing a solid-state imaging device comprising forming a solid-state imaging device in the silicon epitaxial layer of the epitaxial silicon water produced according to the method of producing an epitaxial silicon wafer according to claim 1.

6. An epitaxial silicon water, comprising:
   a silicon wafer;
   a modifying layer containing carbon and hydrogen as a solid solution, the modifying layer being formed in the silicon wafer; and
   a silicon epitaxial layer formed on the modifying layer,
   wherein peaks of concentration profiles of the carbon and the hydrogen in a depth direction of the modifying layer lie in an area with a depth in a range of more than 150 nm and 2000 nm or less from a surface of the silicon wafer.

7. The epitaxial silicon wafer according to claim 6, wherein a distance between a position of the peak of the concentration profile of the carbon in the depth direction and a position of the peak of the concentration profile of the hydrogen in the depth direction is within 1000 nm.

8. The epitaxial silicon wafer according to claim 6, wherein a concentration of the peak of the concentration profile of the carbon in the depth direction and a concentration of the peak of the concentration profile of the hydrogen in the depth direction are both $1\times10^{16}$ atoms/cm$^3$ or more.

9. A method of producing a solid-state imaging device comprising forming a solid-state imaging device in the silicon epitaxial layer of the epitaxial silicon wafer according to claim 6.

* * * * *

UNITED STATES PATENT AND TRADEMARK OFFICE
CERTIFICATE OF CORRECTION

PATENT NO. : 11,245,014 B2
APPLICATION NO. : 16/956232
DATED : February 8, 2022
INVENTOR(S) : T. Kadono et al.

Page 1 of 1

It is certified that error appears in the above-identified patent and that said Letters Patent is hereby corrected as shown below:

In the Claims

Column 14, Line 15 (Claim 5) change "silicon water" to -- silicon wafer --
Column 14, Line 18 (Claim 6) change "silicon water" to -- silicon wafer --

Signed and Sealed this
Twenty-sixth Day of July, 2022

Katherine Kelly Vidal
*Director of the United States Patent and Trademark Office*